(12) United States Patent
Narazaki (10) Patent No.: US 12,205,839 B2
(45) Date of Patent: Jan. 21, 2025

(54) SAMPLE HOLDER

(71) Applicant: KYOCERA Corporation, Kyoto (JP)

(72) Inventor: Yoshinori Narazaki, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 776 days.

(21) Appl. No.: 17/429,367

(22) PCT Filed: Feb. 20, 2020

(86) PCT No.: PCT/JP2020/006876
§ 371 (c)(1),
(2) Date: Aug. 9, 2021

(87) PCT Pub. No.: WO2020/171179
PCT Pub. Date: Aug. 27, 2020

(65) Prior Publication Data
US 2022/0148901 A1    May 12, 2022

(30) Foreign Application Priority Data

Feb. 21, 2019   (JP) ................................ 2019-029711

(51) Int. Cl.
*H01L 21/683* (2006.01)
*H01J 37/32* (2006.01)
*H05B 3/06* (2006.01)

(52) U.S. Cl.
CPC ...... *H01L 21/683* (2013.01); *H01J 37/32724* (2013.01); *H05B 3/06* (2013.01); *H01J 2237/2007* (2013.01)

(58) Field of Classification Search
CPC ............................ H05B 3/06; H01J 37/3272; H01J 2237/2007; H01L 21/683
See application file for complete search history.

(56) References Cited

U.S. PATENT DOCUMENTS

2013/0026720 A1\* 1/2013 Hori .................... H01L 21/6833
279/128

FOREIGN PATENT DOCUMENTS

JP       2011-222978 A1    11/2011

OTHER PUBLICATIONS

Machine Translation of Komatsu (WO 2018/016588), performed on Jun. 4, 2024 (Year: 2018).\*

\* cited by examiner

*Primary Examiner* — Brian W Jennison
(74) *Attorney, Agent, or Firm* — Volpe Koenig (57) ABSTRACT

A sample holder includes an insulating substrate, a heat element, a support member, and a bond. The insulating substrate is a ceramic member having a first surface and a second surface opposite to the first surface. The heat element is on the second surface of the insulating substrate. The second surface of the insulating substrate includes a first portion where the heat element is located, a second portion surrounding the first portion, and a groove between the first portion and the second portion. A surface roughness of the first portion is greater than a surface roughness of the second portion.

10 Claims, 7 Drawing Sheets

SAMPLE HOLDER

FIELD

The present disclosure relates to a sample holder for holding a sample such as a semiconductor wafer in manufacturing processes of semiconductor integrated circuits or liquid crystal displays.

BACKGROUND

A known technique is described in Patent Literature 1.

CITATION LIST

Patent Literature

Patent Literature 1: Japanese Unexamined Patent Application Publication No. 2011-222978

BRIEF SUMMARY

A sample holder according to one or more aspects of the present disclosure includes an insulating substrate having a first surface for a holding sample, and a second surface opposite to the first surface, and a heat element on the second surface of the insulating substrate. The second surface includes a first portion where the heat element is located, a second portion surrounding the first portion, and a groove between the first portion and the second portion. A surface roughness of the first portion is greater than a surface roughness of the second portion.

BRIEF DESCRIPTION OF DRAWINGS

The objects, features, and advantages of the present disclosure will become apparent from the following detailed description and the drawings.

DETAILED DESCRIPTION

A sample holder with a structure that forms the basis of a sample holder according to one or more embodiments of the present disclosure used in, for example, a semiconductor manufacturing apparatus may be an electrostatic chuck. The electrostatic chuck includes a ceramic plate having a main surface with recesses, and electrodes placed in the recesses.

Upon receiving radio frequency (RF) signals applied to the electrodes, the electrostatic chuck may have dielectric breakdown with plasma generated between the electrodes (heat elements) and the periphery of the ceramic plate (insulating substrate).

Figure 1:
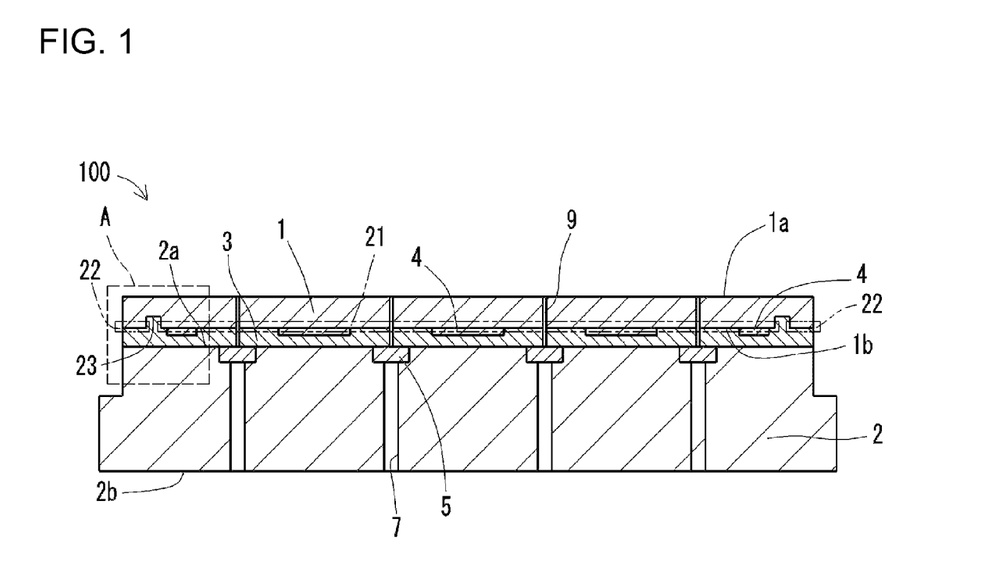
FIG. 1 is a cross-sectional view of a sample holder according to a first embodiment.
Figure 2:
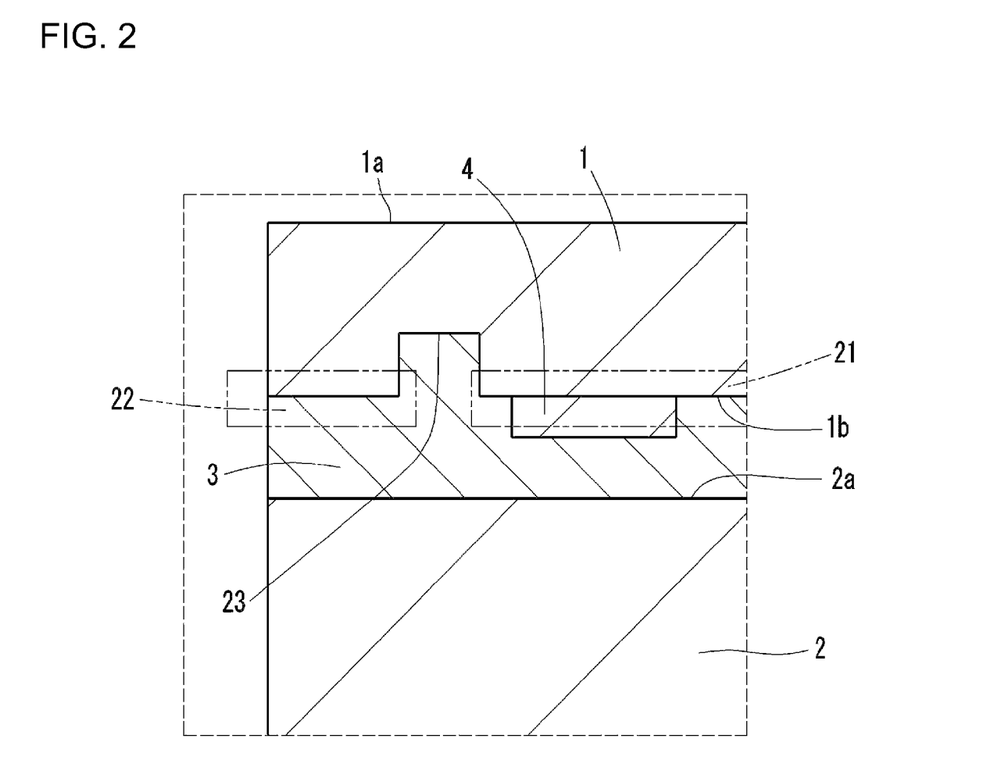
FIG. 2 is a partially enlarged cross-sectional view of area A including a peripheral portion shown in FIG. 1.

A sample holder 100 will now be described with reference to the drawings. FIG. 1 is a cross-sectional view of the sample holder according to a first embodiment. FIG. 2 is a partially enlarged cross-sectional view of area A including a peripheral portion shown in FIG. 1. The sample holder 100 includes an insulating substrate 1, heat elements 4, a support member 2, and a bond 3.

The insulating substrate 1 is a ceramic member having a first surface 1a and a second surface 1b opposite to the first surface 1a. The first surface 1a serves as a sample holding surface that is uniformly flat to hold a sample. The insulating substrate 1 is a plate with any outer shape that may be circular or rectangular.

The insulating substrate 1 is formed from, for example, a ceramic material. Examples of the ceramic material include alumina, aluminum nitride, silicon nitride, and yttria. The insulating substrate 1 may have outer dimensions including a diameter (or side length) of 200 to 500 mm and a thickness of 2 to 15 mm.

The heat elements 4 are located on the second surface 1b of the insulating substrate 1. The heat elements 4 may be formed from a metal material such as platinum, AgPb, tungsten, or molybdenum, and has an electric resistance adjusted to generate heat upon being energized. The electrical resistance can be adjusted by changing the proportion of, for example, a non-conductive material such as a ceramic material added to the metal material. The heat elements 4 may be in other shapes, or may be, for example, stripes, meandering, or in a grid.

During operation, the sample holder 100 uses plasma generated above the first surface 1a of the insulating substrate 1, which serves as the sample holding surface. The plasma may be generated by, for example, applying RF waves between multiple external electrodes and exciting the gas between the electrodes.

The support member 2 is formed from metal. The support member 2 supports the insulating substrate 1. Examples of the metal material include aluminum. The support member 2 may have any outer shape that may be circular or rectangular. The support member 2 may have outer dimensions including a diameter (or side length) of 200 to 500 mm and a thickness of 10 to 100 mm. The support member 2 may have the same outer shape and dimensions as the insulating substrate 1, or may have a different outer shape and dimensions.

The support member 2 and the insulating substrate 1 are bonded together with the bond 3. In detail, the support member 2 has a uniformly flat first surface 2a bonded to the second surface 1b of the insulating substrate 1 with the bond 3. The first surface 2a of the support member 2 and the second surface 1b of the insulating substrate 1 may have the same outer shapes, and may be bonded across the entire surfaces with the bond 3. The bond 3 may be a resin adhesive. Examples of the resin material include a silicone resin. The bond 3 between the first surface 2a of the support member 2 and the heat elements 4 on the second surface 1b of the insulating substrate 1 electrically insulate the heat elements 4 and the support member 2 from each other.

As shown in FIG. 1, the insulating substrate 1 has through-holes 9 (hereafter, first through-holes) each extending from the first surface 1a to the second surface 1b. The support member 2 also has second through-holes 7 each extending from the first surface (one main surface) 2a to a second surface (other main surface) 2b opposite to the first surface 2a. The second through-hole 7 and the first through-hole 9 are continuous with each other and extend from the first surface 1a of the insulating substrate 1, through the bond 3, and to the second surface 2b of the support member 2. The second through-hole 7 and the first through-hole 9 together serve as a gas inlet that receives a gas such as helium at the second surface 2b of the support member 2 and allows the gas to flow toward the first surface 1a of the insulating substrate 1, which serves as the sample holding surface.

The second through-holes 7 in the support member 2 may receive porous members 5 to prevent plasma generated above the first surface 1a as the sample holding surface from entering the support member 2 through the first through-holes 9. Examples of the porous members 5 include a ceramic porous material, such as alumina. The porous members 5 have a porosity that allows gas to flow from the top to the bottom. The porous members 5 in the second through-holes 7 reduce the likelihood of the plasma reaching the support member 2, while allowing the gas to flow through the first through-holes 9. The porous members 5 may have a porosity of, for example, 40 to 60%.

The second surface 1b of the insulating substrate 1 in the present embodiment includes a first portion 21 receiving the heat elements 4, a second portion 22 surrounding the first portion 21, and a groove (hereafter, a first groove) 23 between the first portion 21 and the second portion 22. The bond 3 bonds the first portion 21 and the first surface 2a of the support member 2 together, bonds the second portion 22 and the first surface 2a of the support member 2 together, and fills the first groove 23. The first through-holes 9 are open in the first portion 21. In the present embodiment, for example, the second surface 1b is circular, the second portion 22 is annular along the periphery of the second surface 1b, and the first portion 21, surrounded by the second portion 22, is circular and is concentric with and has a smaller diameter than the second surface 1b. The first groove 23 extends circumferentially between the first portion 21 and the second portion 22. The first portion 21 has a greater surface roughness than the second portion 22. The surface roughness of the first portion 21 is the surface roughness of an exposed portion of the insulating substrate 1, excluding its portion receiving the heat elements 4. In other words, the surface roughness of the first portion 21 excludes the surface roughness of the surfaces of the heat elements 4.

As described above, plasma generated above the first surface 1a leaks near the second surface 1b of the insulating substrate 1 through the first through-holes 9, or flows over the insulating substrate 1 at the periphery to the second surface 1b. This may cause dielectric breakdown between the heat elements 4 and the second portion 22 of the insulating substrate 1. In the present embodiment, the first groove 23 is between the first portion 21 and the second portion 22 to increase the creeping distance between the heat elements 4 and the second portion 22 of the second surface 1b. The surface roughness of the first portion 21 is greater than the surface roughness of the second portion 22 to further increase the creeping distance between the heat elements 4 and the second portion 22 of the second surface 1b and to reduce dielectric breakdown.

The first portion 21 and the second portion 22 may each have a surface roughness indicated by, for example, Ra (arithmetic mean roughness) in accordance with JISB0601. The surface roughness Ra is, for example, 1.0 to 2.0 μm for the first portion 21 and is 0.1 μm to 0.5 μm for the second portion 22.

The surface roughness of the first groove 23 is not particularly limited but may be greater than the surface roughness of the second portion 22. The surface roughness Ra of the first groove 23 is the surface roughness Ra of the bottom of the first groove 23, and is, for example, 1.0 to 2.0 μm. The surface roughness of the first groove 23 greater than the surface roughness of the second portion 22 further increases the creeping distance to reduce dielectric breakdown.

Figure 3:
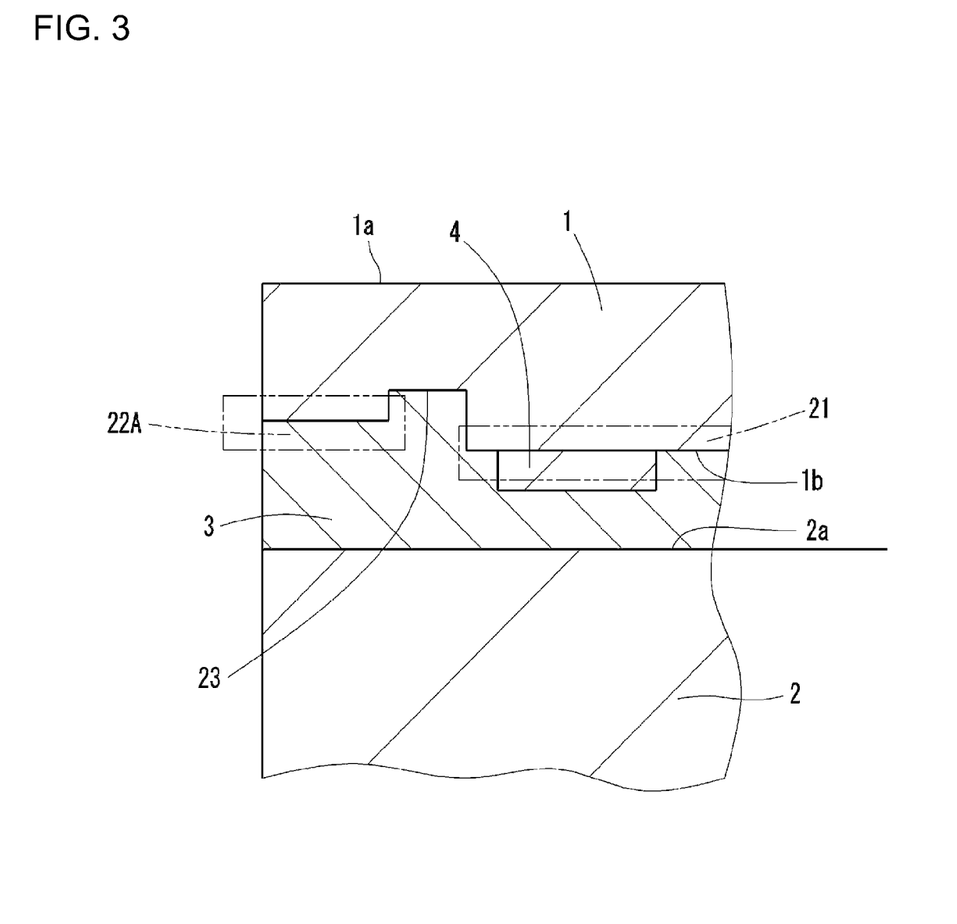
FIG. 3 is a partially enlarged cross-sectional view of an area including a peripheral portion in a second embodiment.

FIG. 3 is a partially enlarged cross-sectional view of an area including a peripheral portion in a second embodiment. A sample holder 100 according to the present embodiment differs from the structure in the first embodiment in its peripheral portion. The components of the sample holder 100 that are the same as in the first embodiment will not be described in detail.

In the first embodiment, the first portion 21 is at the same distance from the first surface 1a as the second portion 22 is from the first surface 1a. In the present embodiment, the first portion 21 is at a greater distance from the first surface 1a than a second portion 22A is from the first surface 1a. The first surface 1a of the insulating substrate 1 is uniformly flat. Thus, the distance from the first surface 1a to the first portion 21 or to the second portion 22A is the thickness of the portion of the insulating substrate 1 having the first portion 21 or having the second portion 22A. More specifically, in the present embodiment, the portion of the insulating substrate 1 having the first portion 21 has a greater thickness than the portion of the insulating substrate 1 having the second portion 22A. In other words, the second portion 22A at the periphery has a smaller thickness than the first portion 21.

The first surface 2a of the support member 2 is at a greater distance to the second portion 22A than to the first portion 21. The bond 3 thus has a larger thickness at the second portion 22A at the periphery than the first portion 21 inward. The bond 3 with a greater thickness provides a greater heat resistance. To reduce heat transfer from the second portion 22A toward the support member 2, the bond 3 has a greater thickness at the periphery, where heat is usually more likely to be transferred to the support member 2. This reduces the difference in surface temperature across the sample holding surface between its portion at the periphery and its portion inward, thus achieving more uniform heat.

Figure 4:
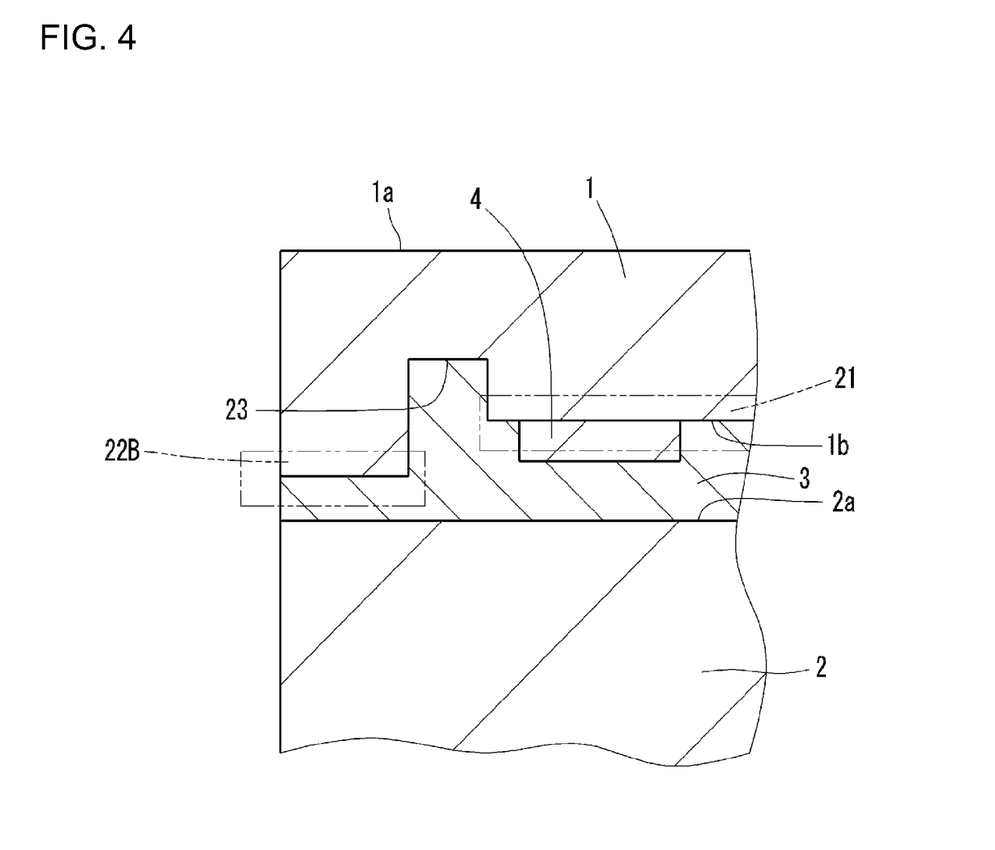
FIG. 4 is a partially enlarged cross-sectional view of an area including a peripheral portion in a third embodiment.

FIG. 4 is a partially enlarged cross-sectional view of an area including a peripheral portion in a third embodiment. A sample holder 100 according to the present embodiment differs from the structure in the first embodiment in its peripheral portion. The components of the sample holder 100 that are the same as in the first embodiment will not be described in detail.

In the first embodiment, the first portion 21 is at the same distance from the first surface 1a as the second portion 22 is from the first surface 1a. In the present embodiment, the first portion 21 is at a smaller distance from the first surface 1a than a second portion 22B is from the first surface 1a. More specifically, in the present embodiment, the portion of the insulating substrate 1 having the first portion 21 has a greater thickness than the portion of the insulating substrate 1 having the second portion 22B. In other words, the second portion 22B at the periphery has a greater thickness than the first portion 21.

Although arc discharge may occur from the heat elements 4 in the first portion 21 to the second portion 22 at the periphery, the thicker second portion 22B causes the discharge path to be non-linear and thus reduces such arc discharge.

Figure 5:
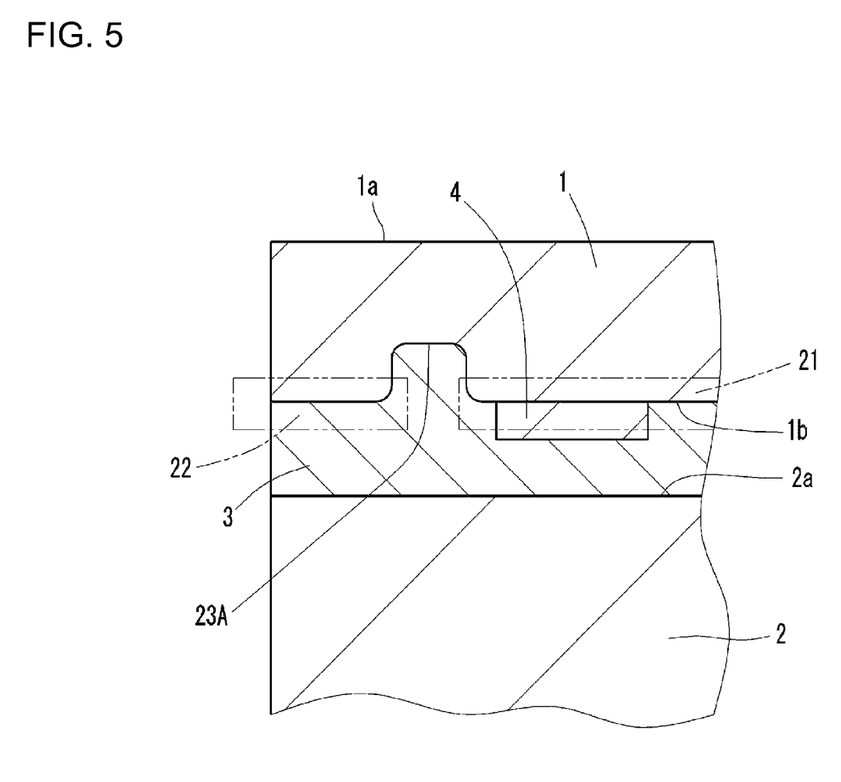
FIG. 5 is a partially enlarged cross-sectional view of an area including a peripheral portion in a fourth embodiment.

FIG. 5 is a partially enlarged cross-sectional view of an area including a peripheral portion in a fourth embodiment. A sample holder 100 according to the present embodiment differs from the structure in the first embodiment in its peripheral portion. The components of the sample holder 100 that are the same as in the first embodiment will not be described in detail.

In the first embodiment, the first groove 23 has angled edges, and angled joints between the inner wall surfaces and the bottom surface. These angled portions may receive concentrated stress generated under an external mechanical impact or an impact caused by heat or other factors and may cause cracks or chips. In the present embodiment, a first groove 23A has curved edges, and curved joints between the inner wall surfaces and the bottom surface to disperse stress generated in these portions and prevent cracks and chips.

Figure 6:
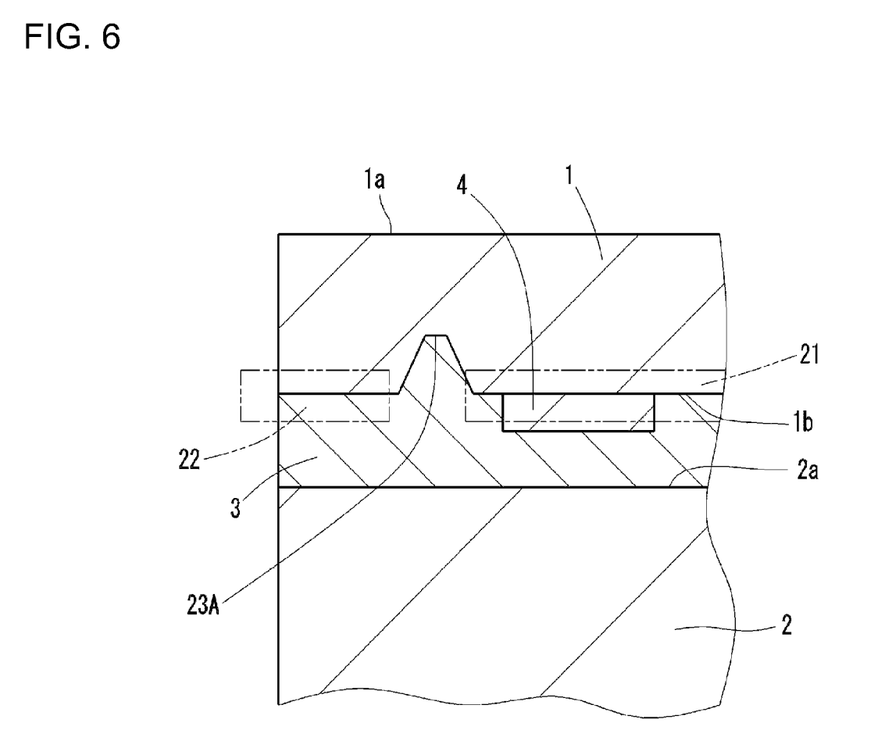
FIG. 6 is a partially enlarged cross-sectional view of an area including a peripheral portion in a fifth embodiment.

FIG. 6 is a partially enlarged cross-sectional view of an area including a peripheral portion in a fifth embodiment. A sample holder 100 according to the present embodiment differs from the structure in the first embodiment in its peripheral portion. The components of the sample holder 100 that are the same as in the first embodiment will not be described in detail.

In the first embodiment, the first groove 23 has a constant width from the opening to the bottom surface. In the present embodiment, a first groove 23A has a width decreasing from the opening to the bottom surface. The first groove 23A has an internal space that decreases relatively and thus has a smaller amount of the bond 3 filling the space. As described above, the bond 3 is a material to increase thermal resistance. A smaller amount of the bond 3 provides a smaller heat resistance. Although the portion of the first surface 1a facing the first groove 23A is more likely to be overheated with heat generated by the heat elements 4, the first groove 23A provides a smaller thermal resistance and thus allows more heat transfer to the support member 2 to reduce overheating.

Figure 7:
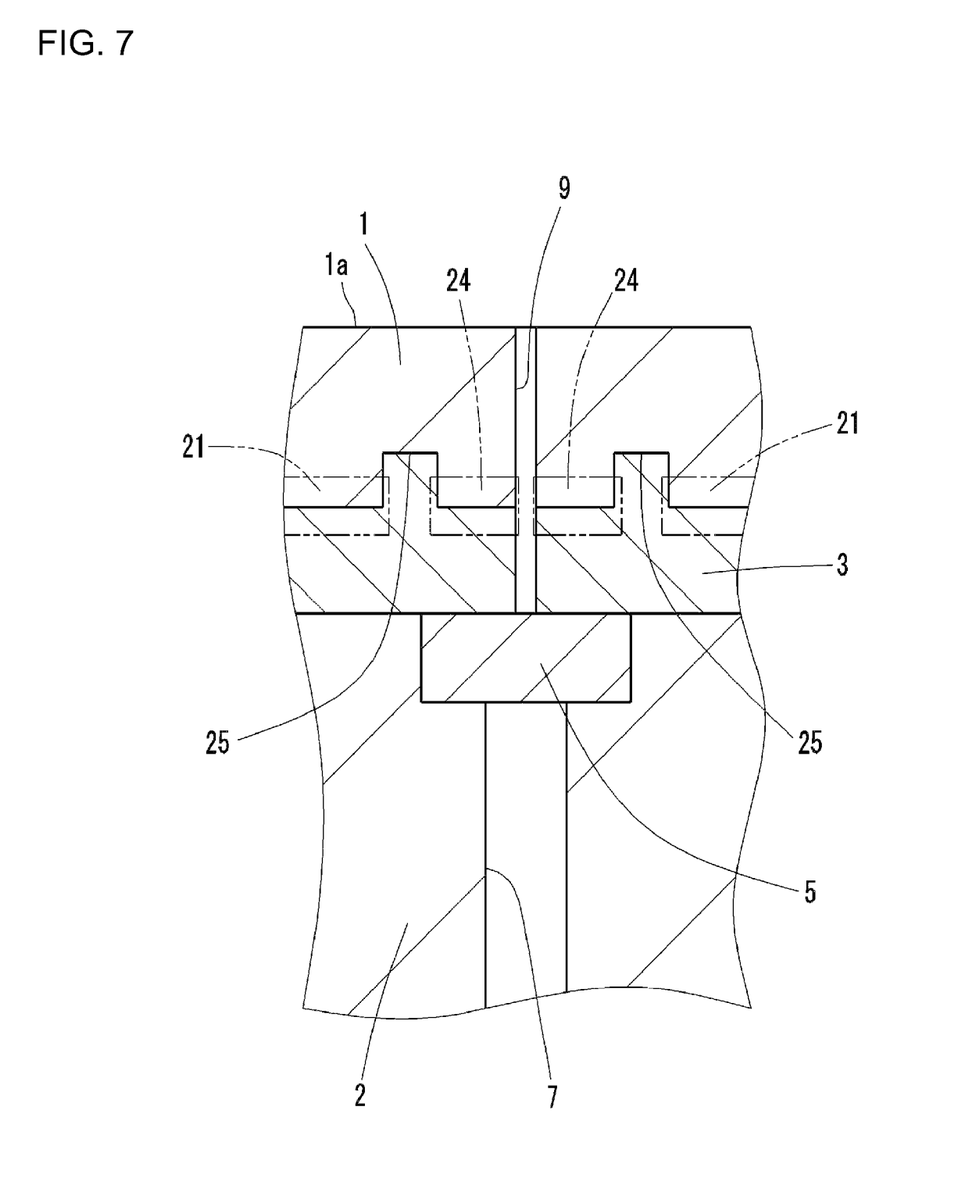
FIG. 7 is a partially enlarged cross-sectional view of an area including a first through-hole in a sixth embodiment.

FIG. 7 is a partially enlarged cross-sectional view of an area including a first through-hole in a sixth embodiment. A sample holder 100 according to the present embodiment differs from the structure in the first embodiment in an area including the first through-holes. The components of the sample holder 100 that are the same as in the first embodiment will not be described in detail.

The insulating substrate 1 in the present embodiment has a second surface 1b including third portions 24 surrounding the openings of the first through-holes 9 and second grooves 25 between a first portion 21 and the third portions 24. Each third portion 24 corresponds to a part of the first portion 21 in the above embodiments, and is annular around the opening of the corresponding first through-hole 9. Each third portion 24 is annular and is surrounded by the first portion 21. Each second groove 25 is located between the first portion 21 and the corresponding third portion 24.

In the present embodiment, the first portion 21 has a greater surface roughness than the third portions 24. As described above, plasma may leak near the second surface 1b of the insulating substrate 1 through the first through-holes 9. The plasma may cause dielectric breakdown between the heat elements 4 and the third portions 24 of the insulating substrate 1. In the present embodiment, the second grooves 25 are between the first portion 21 and the third portions 24 to increase the creeping distance between the heat elements 4 and the third portions 24 of the second surface 1b. The surface roughness of the first portion 21 greater than the surface roughness of the third portions 24 further increases the creeping distance between the heat elements 4 and the third portions 24 of the second surface 1b to reduce dielectric breakdown. The surface roughness Ra of the third portions 24 is, for example, 0.1 to 0.5 μm.

The surface roughness of the second grooves 25 is not particularly limited, but may be greater than the surface roughness of the third portions 24. The surface roughness Ra of each second groove 25 is the surface roughness Ra of the bottom of each second groove 25 similarly to the first groove 23, and is, for example, 1.0 to 2.0 μm. The surface roughness of the second grooves 25 greater than the surface roughness of the third portions 24 further increases the creeping distance to reduce dielectric breakdown.

The present disclosure may be implemented in the following form.

A sample holder according to one or more embodiments of the present disclosure includes an insulating substrate being a plate having a first surface as a sample holding surface and a second surface opposite to the first surface.

The sample holder includes a heat element on the second surface of the insulating substrate.

The second surface includes a first portion receiving the heat element, a second portion surrounding the first portion, and a groove between the first portion and the second portion.

The first portion has a greater surface roughness than the second portion.

The sample holder according to one or more embodiments of the present disclosure may have a larger creeping distance between the heat element and the second portion of the second surface to reduce dielectric breakdown.

Although the present disclosure is described in detail, the present disclosure is not limited to the embodiments described above, and may be changed or modified in various manners without departing from the spirit and scope of the present disclosure. For example, the bond 3 may be located partially between the second surface 1b of the insulating substrate 1 and the first surface 2a of the support member 2, instead of being entirely between the second surface 1b of the insulating substrate 1 and the first surface 2a of the support member 2.

REFERENCE SIGNS LIST 1 insulating substrate
1a first surface
1b second surface
2 support member
2a first surface
2b second surface
3 bond
4 heat element
5 porous member
7 second through-hole
9 first through-hole
21 first portion
22 second portion
22A second portion
22B second portion
23 first groove
23A first groove
24 third portion
25 second groove
100 sample holder

The invention claimed is:

1. A sample holder, comprising:
an insulating substrate having a first surface for a holding sample, and a second surface opposite to the first surface; and
heat elements on the second surface of the insulating substrate, wherein the second surface includes a first portion, a second portion surrounding the first portion, and a groove between the first portion and the second portion, the first portion being an area where all the heat elements are located, and a surface roughness of the first portion is greater than a surface roughness of the second portion.

2. The sample holder according to claim 1, wherein a surface roughness of the groove is greater than the surface roughness of the second portion.

3. The sample holder according to claim 1, wherein a distance from the first portion to the first surface is greater than a distance from the second portion to the first surface.

4. The sample holder according to claim 1, wherein a distance from the first portion to the first surface is smaller than a distance from the second portion to the first surface.

5. The sample holder according to claim 1, wherein the groove has a curved edge, and a curved joint between an inner wall surface and a bottom surface of the groove.

6. The sample holder according to claim 1, wherein the groove has a width decreasing from an opening to a bottom surface of the groove.

7. The sample holder according to claim 1, wherein the insulating substrate has a through-hole extending from the first surface to the second surface, the second surface includes a third portion surrounding an opening of the through-hole, and a second groove between the first portion and the third portion, and the surface roughness of the first portion is greater than a surface roughness of the third portion.

8. The sample holder according to claim 1, further comprising:

a support member supporting the second surface of the insulating substrate, the support member comprising a metal.

9. A sample holder, comprising:

an insulating substrate having a first surface for a holding sample, and a second surface opposite to the first surface; and a heat element on the second surface of the insulating substrate, wherein the second surface includes a first portion where the heat element is located, a second portion surrounding the first portion, and a groove between the first portion and the second portion, a surface roughness of the first portion is greater than a surface roughness of the second portion, and the groove has a width decreasing from an opening to a bottom surface of the groove.

10. A sample holder, comprising:

an insulating substrate having a first surface for a holding sample, and a second surface opposite to the first surface;

a heat element on the second surface of the insulating substrate; and a support member supporting the second surface of the insulating substrate, the support member comprising a metal, wherein the second surface includes a first portion where the heat element is located, a second portion surrounding the first portion, and a groove between the first portion and the second portion, and a surface roughness of the first portion is greater than a surface roughness of the second portion.

* * * * *